(12) United States Patent
Owada

(10) Patent No.: US 6,219,396 B1
(45) Date of Patent: Apr. 17, 2001

(54) JITTER RESISTANT CLOCK REGENERATOR

(75) Inventor: Satoshi Owada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/071,832

(22) Filed: May 4, 1998

(30) Foreign Application Priority Data

May 23, 1997 (JP) ................................ 9-133349

(51) Int. Cl.[7] ................ H04L 7/00; H04L 7/04
(52) U.S. Cl. ............................... 375/372; 375/362
(58) Field of Search ................. 375/372, 362, 375/363; 370/516, 517, 518

(56) References Cited

U.S. PATENT DOCUMENTS

| 4,054,747 | * | 10/1977 | Pachynski, Jr. | 375/372 |
|---|---|---|---|---|
| 4,181,975 | * | 1/1980 | Jenkins | 370/517 |
| 4,596,026 | * | 6/1986 | Cease et al. | 375/372 |
| 5,014,271 | * | 5/1991 | Fujimoto | 370/505 |
| 5,210,773 | * | 5/1993 | Schmid et al. | 375/215 |

* cited by examiner

Primary Examiner—Stephen Chin
Assistant Examiner—Tony Al-Beshrawi
(74) Attorney, Agent, or Firm—Venable; Robert J. Frank; Michael A. Sartori

(57) ABSTRACT

A jitter resistant clock regenerator for receiving program data transmitted on a transmission channel in synchronism with a transmission clock signal and cancelling jitter, having occurred on the channel, to restore from the transmitted program data a highly accurate program clock signal from which the jitter is removed. The regenerator includes a buffer for temporarily storing transmitted data received over the channel. A read clock selector monitors the buffer to determine the amount of the transmitted data stored in the buffer, and selects one of read clock signals in response to the data amount. A program clock acquisition circuit reads out the transmitted data from the buffer in response to a read clock signal selected by the selector, and restores the clock signal of the program data from the transmitted data.

6 Claims, 2 Drawing Sheets

JITTER RESISTANT CLOCK REGENERATOR

BACKGROUND OF THE INVENTION

1. Field of the Invention

The present invention relates to a jitter resistant clock regenerator advantegeously applicable to terminal equipment, and more particularly to a jitter resistant clock regenerator for restoring from transmitted data received on a channel a program clock signal which is used for processing program data that are defined in this specification generally as various data for use in media in an upper layer.

2. Description of the Background Art

Today, there is an increasing demand for a network system integrating multiple types of media, and its related techniques have been intensively developed. Such a network is adapted to transmit over the same channel various types of medium data, called program data hereinbelow, to be processed at different processing rates which is independent of the transmission rate of the channel.

For these program data to preferably be processed at their appropriate processing rates on a receiver site, some mechanism is required for transmitting together with the program data clock signals, called program clock signals from now on, corresponding to the processing rates of the program data, and for restoring them at the receiver site.

Thus, a method is employed which embeds timing signals in the program data at the transmitter site so that the receiver site can restore the program clock signals by extracting the timing signals from the received program data. Such a method conventionally uses a PLL (Phase-Locked Loop) circuit to align the phase of oscillation with the phase of the timing signals, thus to restore the program clock signals needed for processing the program data.

It is unavoidable, however, that jitter is involved in the transmitted data owing to transmission delay or the like encountered on the channel. Therefore, extracting the timing signals for the program data directly from the transmitted data on which the jitter is involved, and supplying the extracted timing signals to the PLL circuit may cause degradation in the accuracy of the restored program clock signals due to the timing signals momentarily fluctuated.

In view of this, it would be possible to design the lowpass filter constituting the PLL circuit so as to have its time constant increased to reduce the effect of the jitter. This, however, presents another problem of complicating the circuit and delaying the start time of the clock signal acquisition.

SUMMARY OF THE INVENTION

It is therefore an object of the present invention to provide a jitter resistant clock regenerator capable of restoring a program clock signal free from jitter with a simple circuit configuration without including a PLL circuit.

To accomplish the object, in accordance with the present invention, a clock regenerator for restoring a clock signal of program data from transmitted data synchronized with a transmission clock signal on a transmission channel, wherein the program data are for use in various types of media in an upper layer, and the clock signal of the program data is independent of the transmission clock signal, comprises: a receiving buffer for temporarily storing the transmitted data received over the transmission channel; a read clock selector circuit for monitoring a data amount of the transmitted data stored in the receiving buffer, and for selecting one of read clock signals in response to the data amount; and a program clock acquisition circuit for reading out the transmitted data from the receiving buffer in response to a read clock signal selected by the read clock selecting circuit, and for restoring the clock signal of the program data from the transmitted data.

The clock regenerator in accordance with the present invention selects a lower rate read clock signal when the amount of data stored in the receiving buffer is less than a reference level, and a higher rate read clock signal when the data amount is greater than the reference level so that the data amount is kept substantially at an average value. As a result, the average rate with respect to the rate of the program clock signal to be detected, which has a much longer period than that of the fluctuations in the timing signals due to the jitter, takes a constant rate free from the effect of the jitter. This enables the program clock signal unaffected by the jitter to be recovered by a simpler circuit without using a PLL circuit.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENT

Figure 1:
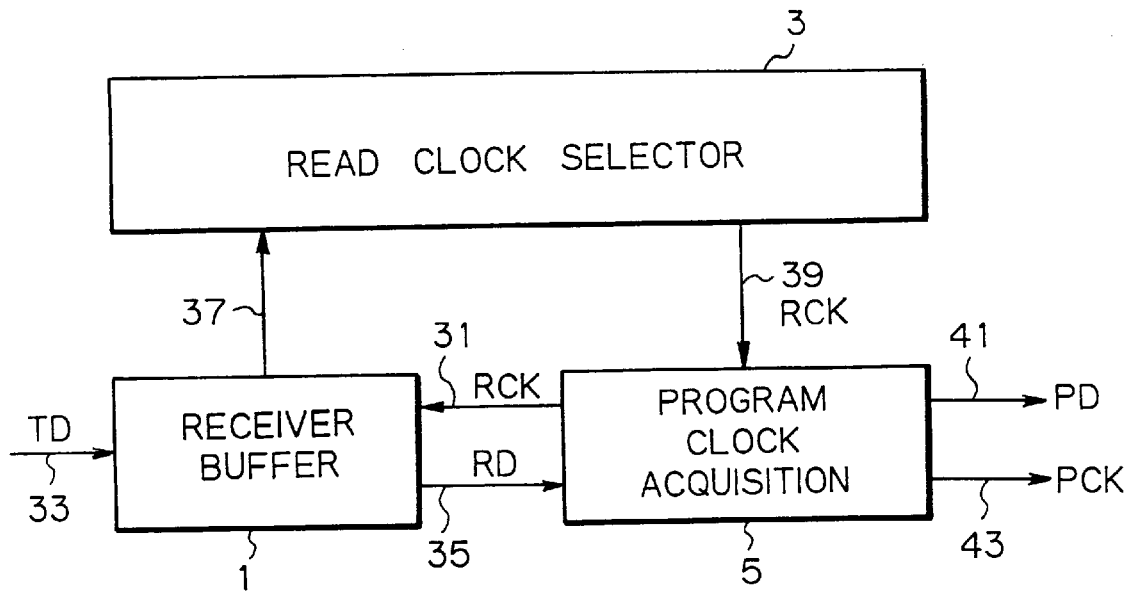
FIG. 1 is a schematic block diagram showing a specific preferred embodiment of a clock regenerator in accordance with the present invention.

Referring to FIG. 1, which shows a preferred embodiment of a clock regenerator in accordance with the present invention, the clock regenerator is adapted to receive program data transmitted on a transmission channel 33 in synchronism with a transmission clock signal and cancel jitter, having occurred on the transmission channel 33, by means of a buffer 1 and a read clock signal RCK, to thereby restore from the transmitted program data a highly accurate program clock signal PCK from which the jitter is removed.

The clock regenerator generally comprises, in addition to the receiving buffer 1, a read clock selector circuit 3 and program clock acquisition circuit 5. The receiver buffer 1 is a FIFO (first-in first-out) memory circuit for temporarily storing therein transmitted data TD received over a transmission channel 33, and for reading out the stored data RD on a connection line 35 in response to a read clock signal RCK supplied from the program clock acquisition circuit 5 on a connection 31. As shown, the receiver buffer 1 has an input port which is interconnected to the transmission channel 33, and is adapted to receive various types of program data for use in media in an upper layer with a timing signal associated with a program clock signal inserted therein which has nothing to do with, or independent of, the transmission clock signal on that transmission channel 33.

The read clock selector circuit 3 is adapted to periodically monitor the receiving buffer 1 at a predetermined monitoring time interval Tk by a connection line 37 to determine how much buffering space remains in which transmitted data are to be stored. The selector 3 selects in turn one of a plurality of read clock signals which is appropriate for the remaining buffer space thus monitored, and supplies the selected read clock signal RCK to the program clock acquisition circuit 5 via a connection line 39. The predetermined monitoring and read clock signal selection interval Tk is designed short enough to regulate the average rate $f_{av}$ of the read clock signal RCK selected during the contiguous time intervals such that the average rate $f_{av}$ becomes substantially equal to the normal transmission rate $f_{sd}$ of the data TD transmitted over the input channel 33.

To achieve the regulation, there are advantageously prepared at least two read clock signals which differ in frequency or rate from each other: one has a frequency $f_h$ which is significantly higher than the frequency $f_{sd}$ of transmitting the data TD on the channel 33; and the other has a frequency $f_l$ which is significantly lower than the transmission frequency $f_{sd}$.

The read clock signal RCK supplied to the program clock acquisition circuit 5 switches between the two frequencies. The monitoring and read clock signal selection interval Tk of the read clock selecting circuit 3 is so designed as to be much shorter than the period of time in which the program clock acquisition circuit 5 extracts the program clock PCK from the transmitted data RD developed from the buffer 1, so that the fluctuations involved in the data developed from the buffer 1 due to the read clock switching do not affect the stability of the clock rate of the program clock signal extracted or restored by the program clock acquisition circuit 5.

The program clock acquisition circuit 5 reads out, in response to the read clock signal RCK fed from the read clock switching circuit 3, the transmitted data RD stored in the receiving buffer 1 on its input port 35. The program clock acquisition circuit 5 periodically extracts the timing signals from the read transmitted data RD, thereby restoring the program clock signal. The acquisition circuit 5 in turn outputs the program data PD and the program clock signal PCK on its output ports 41 and 43, respectively. The time interval at which the acquisition circuit 5 periodically extracts the timing signals is set much longer than the predetermined time interval Tk at which the read clock selecting circuit 3 monitors the buffer 1 and selects a read clock signal.

In operation, the read clock selector circuit 3 periodically monitors the receiving buffer 1 at a predetermined monitoring time interval Tk. When the transmission rate on the channel 33 drops temporarily from its nominal rate $f_{sd}$ so that the amount of data stored in the receiving buffer 1 reduces, the read clock selector circuit 3 detects this when monitoring the buffer 1. The selector 3 in turn selects a read clock signal whose rate $f_l$ is significantly lower than that of the current transmission rate. The program clock acquisition circuit 5 is operative in response to the lower read clock signal RCK fed from the read clock switching circuit 3 to read out the transmitted data RD from the receiving buffer 1 on its input port 35. The acquisition circuit 5 extracts the timing signals from the read transmitted data RD. This will increase the amount of data stored in the receiving buffer 1 so that the buffer residual amount, or the remaining storage space of the buffer 1, increases toward its average value. The acquisition circuit 5 develops the program data PD and the program clock signal PCK on its output ports 41 and 43, respectively.

On the other hand, when the transmission rate on the channel 33 increases temporarily so that the amount of data stored in the receiving buffer 1 increases, the read clock selector circuit 3 detects this in the same way as described above, and selects a read clock signal whose rate $f_h$ is significantly higher than that of the transmission rate. This will reduce the amount of data in the receiving buffer 1 so that the buffer residual amount recovers its average value.

As understood from the above, the detection of the buffer residual amount needed for the switch control of the read clock signal RCK is carried out much more frequently than the timing signal extraction performed by the program clock acquisition circuit 5, so that the switching between the read clock signals is also performed at a correspondingly higher rate. This enables the rate at which the program clock acquisition circuit 5 reads out the transmitted data from the receiving buffer 1 to be averaged, and accordingly the program clock acquisition circuit 5 to read out the data at a nearly constant rate. Thus, the program clock acquisition circuit 5 can restore the program clock signal PCK at high accuracy without undergoing the effect of the fluctuations on the channel 33.

The description of a specific configuration of the read clock selector circuit 3, which is an important circuit of the embodiment, will be given in more detail with reference to FIGS. 2 and 3. An embodiment shown in FIG. 2 employs a variable frequency oscillator 9 that can selectively generate one of a plurality of read clock signals with frequencies $f_{av}$, $f_h$ and $f_l$ different from each other whereas an alternative embodiment shown in FIG. 3 uses a fixed frequency oscillator 11 in conjunction with frequency dividers 13 and 15 with different dividing ratios to provide a couple of read clock signals with frequencies $f_h$ and $f_l$. In the following, the signals are designated by the reference numerals directed to the connections on which the signals appear.

Figure 2:
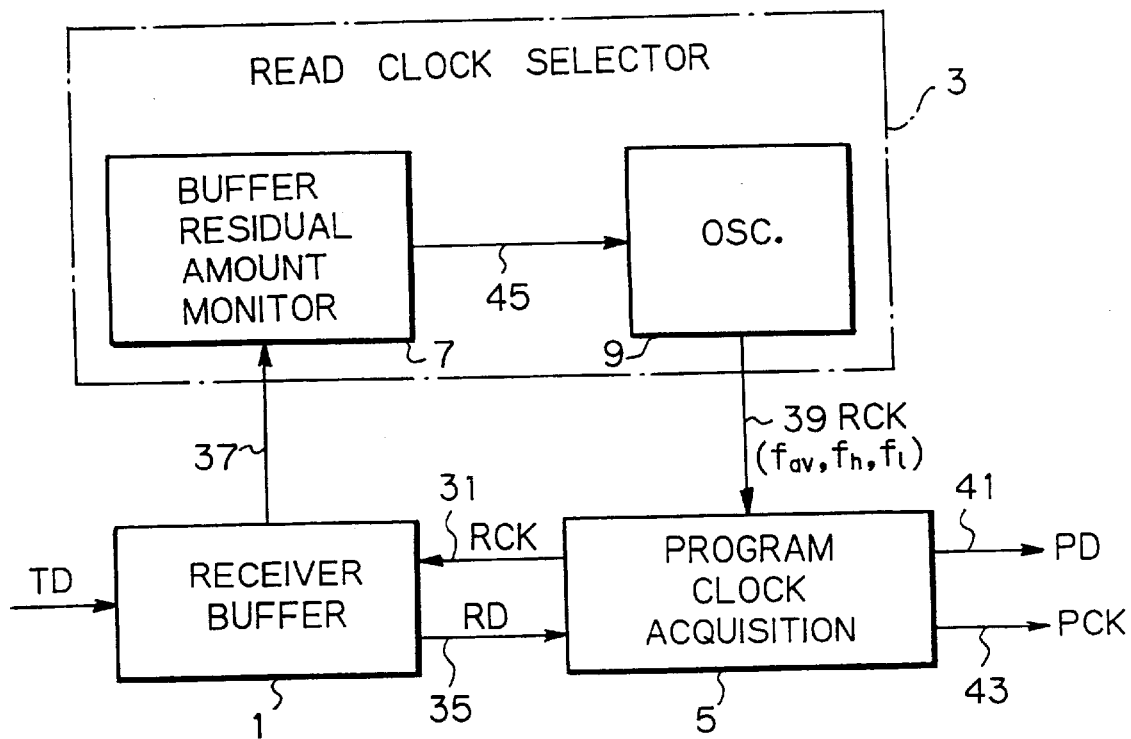
FIG. 2 is a schematic block diagram, like FIG. 1, showing the clock regenerator in accordance with the invention, which includes a specific structure of the read clock selecting circuit in the illustrative embodiment having a single oscillator for generating a plurality of read clock signals.

FIG. 2 shows a specific configuration of an embodiment of the read clock selector circuit 3, in which the like portions to those of FIG. 1 are designated by the same reference numerals. The read clock selector circuit 3 comprises a buffer residual amount monitor circuit 7 and a variable frequency oscillator 9. The buffer residual amount monitor circuit 7 is adapted to periodically monitor the buffer 1 at predetermined intervals Tk to determine a residual amount of data, or a remaining space from its storage capacity, in the receiving buffer 1 and commands the oscillator 9 to oscillate at its oscillation frequency appropriate for the detected result. The buffer residual amount monitor circuit 7 may be adapted to periodically determine how much data are stored with respect to its storage capacity.

The predetermined intervals Tk, at which the buffer residual amount monitor circuit 7 detects the buffer residual amount, is set much shorter than the intervals of the timing signals which are inserted into the transmitted data TD for restoring the program clock signal PCK. The buffer residual amount monitor circuit 7 is interconnected to the variable frequency oscillator 9 to control the frequency of the oscillator 9. The oscilator 9 has its selective oscillation frequencies $f_{av}$, $f_h$ and $f_l$ different from each other. The buffer residual amount monitor circuit 7 is adapted to control the oscillator 9 in such a fashion that the oscillator 9 generates a frequency lower than the current one when the buffer residual amount 45 is smaller than a predetermined reference value, and higher one when it is larger than the reference value.

The variable frequency oscillator 9 is adapted to change its oscillation frequency under the control of the buffer residual amount monitor circuit 7. In the instant embodiment, the oscillator 9 can selectively generates one of three frequencies $f_{av}$, $f_h$ and $f_l$ in response to the buffer residual amount signal 45 provided from the monitor circuit 7. The frequency $f_{av}$ corresponds to the normal transmission rate $f_{sd}$ without jitter, the frequency $f_h$ (higher than $f_{av}$) is significantly higher than the transmission rate $f_{sd}$ on the channel 33, and the frequency $f_l$ (lower than $f_{av}$) is significantly lower than the transmission rate $f_{sd}$.

In operation, data TD have been transmitted at the normal transmission rate $f_{sd}$ over the channel 33 and received to be stored in the receiving buffer 1 as described with reference to FIG. 1. The oscillator 9 is oscillating at the normal frequency $f_{av}$. When the transmission rate of the channel 33 temporarily drops, the read speed of the receiving buffer 1 exceeds relatively the write speed thereof, so that the data amount in the receiving buffer 1 begins to reduce. The buffer residual amount monitor circuit 7, which periodically monitors the buffer 1 at the predetermined intervals Tk, immediately detects the reduction of the data amount, or the increase of the remaining storage space, in the buffer 1, and in turn commands the oscillator 9 to select the lowest oscillation frequency $f_l$.

Since the monitoring interval Tk is sufficiently shorter than the interval at which the program clock acquisition circuit 5 extracts the program clock PCK so that the frequency $f_l$ of the read clock signal RCK changes at a rate significantly faster than the rate of fluctuation or jitter of the transmitted data TD on the channel 33, the amount of data stored in the buffer 1 begins to increase accordingly. When the buffer residual amount monitor circuit 7 determines when the data amount in the receiving buffer 1 reaches its normal condition, the monitor circuit 7 commands the oscillator 9 to return its frequency to the normal frequency $f_{av}$.

On the other hand, when the transmission rate of the channel temporarily increases so that the write speed of the receiving buffer 1 exceeds the read speed thereof, the data amount of the receiving buffer 1 begins to increase. The buffer residual amount monitor circuit 7 periodically monitors the buffer 1 and immediately detects the increase of the data stored, and accordingly commands the oscillator 9 to select the highest oscillation frequency $f_h$. Since the monitoring interval Tk is sufficiently shorter than the program clock extracting interval of the acquisition circuit 5, the amount of data stored in the buffer 1 begins to reduce. When the buffer residual amount monitor circuit 7 determines when the data amount in the receiving buffer 1 restores its normal storage amount, the monitor circuit 7 commands the oscillator 9 to return its frequency to the normal frequency $f_{av}$.

The foregoing read clock frequency shifting operation is repeated every time the data amount or the remaining storage space in the receiving buffer 1 changes. As a result, it is macroscopically, or in the longer term, seen that the frequency of the read clock signal RCK generated by the oscillator 9 substantially equals the normal frequency $f_{av}$. Microscopically, or in the shorter term, however, the read clock signal RCK includes the fluctuations with a period T given by the following equation (1), as long as the three frequencies $f_{av}$, $f_h$ and $f_l$ are switched.

$$T = Tk*(Tt/Td)*U, \qquad (1)$$

where Tk represents the detection interval of the buffer residual amount, Tt the period of fluctuations in the transmission rate on the channel 33, and Td the difference in period between the read clock signals $f_{av}$ and $f_h$ or $f_l$. In addition, U is representative of the amount of unit change in remaining storage space, or stored data, in the receiving buffer 1 resultant from the read clock signal RCK shifting its frequency.

If the period T were not negligibly short with respect to the extraction intervals of the timing signals from the transmitted data RD, it could not be expected to achieve a highly accurate regeneration of the program clock signal PCK. With the present embodiment, however, the difference in period between the read clock signals, Td, which corresponds to the difference $f_h-f_{av}$, or $f_{av}-f_l$, is set significantly larger than the period of fluctuations Tt in the transmission rate on the channel 33, and the detection interval Tk of monitoring and determining the buffer residual amount and the amount of unit change in remaining storage space U in the receiving buffer 1 are selected significantly small. This follows that the periodic fluctuation involved in the read clock signals RCK has little effect on the operation of extracting the timing signals in the program clock acquisition circuit 5.

Besides, as long as the transmitted rate of the data TD transmitted on the channel 33 is nearly stationary, the oscillator 9 can switch between the oscillation frequencies $f_{av}$, $f_h$ and $f_l$ without delay. This makes it possible to eliminate the delay involved in using the lowpass filter in the prior art, and to reduce the effect of the switching on the regeneration start timing as described with reference to the prior art.

Thus, the illustrative embodiment comprises the oscillator 9 that switches its oscillation frequency at three steps in response to the residual amount of the receiving buffer 1 so that the average rate of the read clock signal RCK, which is used for reading out the transmitted data RD from the receiving buffer 1, is kept nearly equal to the normal transmitted rate $f_{sd}$ without being affected by the rate fluctuation on the transmission channel 33. Thus, the clock regenerator is implemented which can restore the program clock signal PCK from the buffered, transmitted data TD at high accuracy with a simpler configuration without using a PLL circuit.

Although the foregoing embodiment includes the oscillator 9 that switches its oscillation frequency at three steps, this is not essential. For example, an oscillator can advantageously be applied which switches its oscillation frequency at two steps, or at four or more steps.

Figure 3:
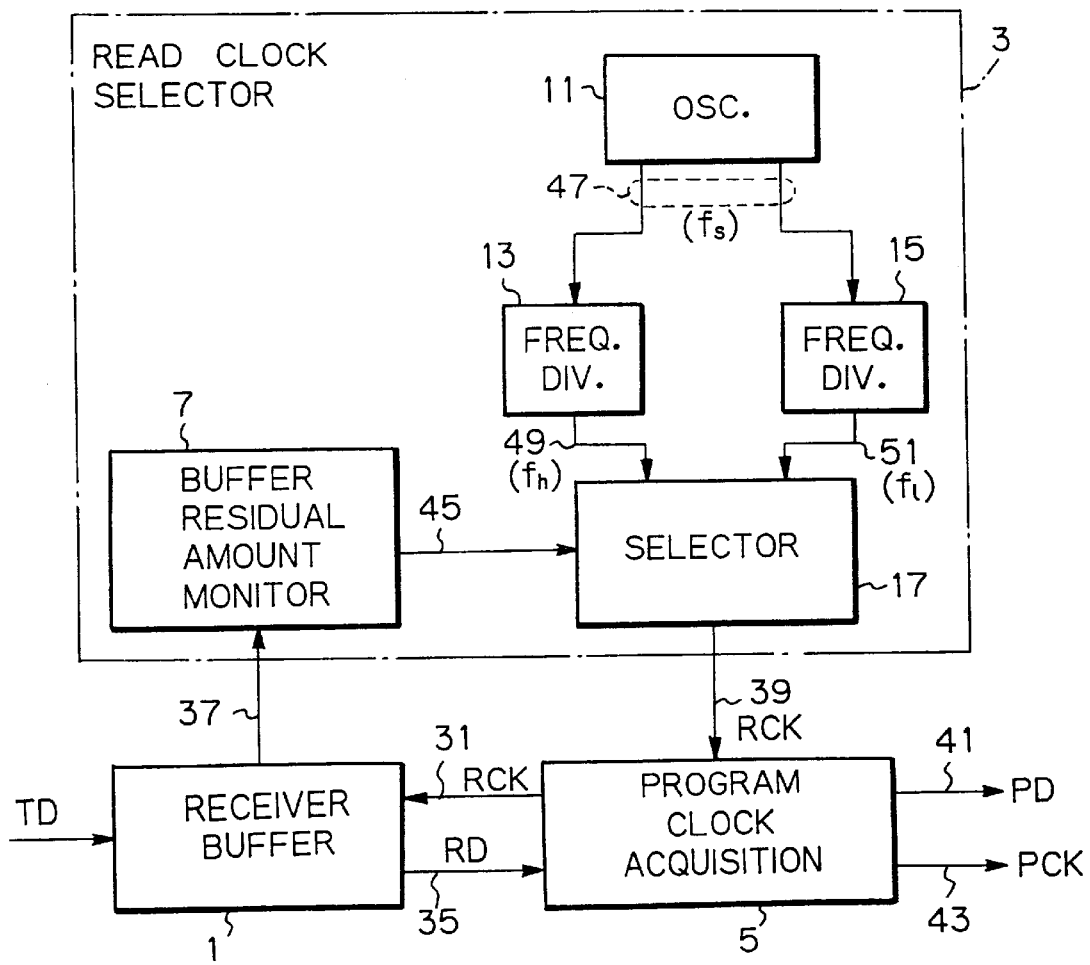
FIG. 3 is a schematic block diagram, like FIG. 2, showing the clock regenerator in accordance with the invention, which includes an alternative structure of the read clock selecting circuit in the embodiment having frequency dividers for generating read clock signals.

Now, FIG. 3 shows an altenrative embodiment of the read clock selector circuit 3. In the figure, like portions to those of FIG. 1 are designated by the same reference numerals. The read clock selector circuit 3 of the present embodiment comprises a fixed frequency oscillator 11, frequency dividers 13 and 15, and selector 17 having a control input connected to the output 45 from the buffer residual amount monitor circuit 7.

The buffer residual amount monitor circuit 7 is adapted to detect the residual amount of the receiving buffer 1 at the predetermined intervals, as in the embodiment shown in and described with reference to FIG. 2. The monitor circuit 7 controls the selector 17 to selectively output one of two control signals in response to the detected result. The buffer residual amount detection interval Tk of the buffer residual amount monitor circuit 7 is set significantly shorter than the intervals of the timing signals included in the transmitted data TD for restoring the program clock signal, as discussed earlier. The buffer residual amount monitor circuit 7 controls the selector 17 such that it selects the frequency $f_h$ output from the one frequency divider 13 to quicken the read clock signal RCK when the buffer residual amount is less than half the buffer capacity of the buffer 1, and the frequency $f_l$ output from the other frequency divider 15 to slow the read clock signal RCK when the buffer residual amount is greater than half the buffer capacity.

The fixed frequency oscillator 11 is a reference clock oscillator for oscillating at a stable reference frequency $f_s$ several times higher than the clock signal $f_{sd}$ used for transmitting data TD on the channle 33 such as a transport stream (TS) clock signal to develop the frequency $f_s$ on its outputs 47. The one frequency divider 13 is adapted to divide the oscillation frequency $f_s$ of the fixed frequency oscillator 11 to generate on its output 49 a clock signal with a frequency $f_h$ higher than the frequency $f_{av}$, which should be the nominal frequency $f_{av}$ of the transmission channel 33, by $f_b$, that is, $$f_h = f_{av} + f_b. \tag{2}$$

The other frequency divider 15 is also adapted to divide the oscillation frequency $f_s$ of the fixed frequency oscillator 11 to generate on its output 51 a clock signal with a frequency $f_l$ lower than the aforementioned frequency $f_{av}$ by $f_b$, that is, $$f_l = f_{av} - f_b. \tag{3}$$

The selector 17 is adapted to receive the clock signals $f_h$ and $f_l$ from the frequency dividers 13 and 15, respectively, and selects one of the two inputs in response to the control command 45 fed from the buffer residual amount monitor circuit 7 to output selected one on its output port 39 as the read clock signal RCK.

In operation, the transmitted data TD is received over the channel 33 and stored in the receiving buffer 1, as described earlier. With the alternativbe embodiment, even while the transmission rate of the channel 33 is kept at the normal rate $f_{sd}$, the buffer residual amount monitor circuit 7 provides the selector 17 with either of the selective control signals which instructs the selector 7 to select higher or lower frequency $f_h$ or $f_l$. The program clock acquisition circuit 5 therefore receives from the selector 17 either the read clock signal $f_h$ or $f_l$ which is higher or lower than the transmission rate $f_{av}$ by the amount of $f_b$.

The selector 17 intermittently selects the read clock signal $f_h$ or $f_l$, namely, the read clock signal RCK provided to the acquisition circuit 5 is shifted between the frequencies $f_h$ or $f_l$. Therefore, the residual amount of the receiver buffer 1 moves up and down around the middle of the buffering capacity of the buffer 1, and the buffer residual amount monitor circuit 7 continues to control the selector 17 to select either the read clock signal $f_h$ or $f_l$ alternately. As a result, the transmitted data RD read out from the receiving buffer 1 by the program clock acquisition circuit 5 suffers from jitter which has the frequency equal to $f_b$ and the duration equal to the buffer residual amount detection interval Tk.

The jitter period equal to Tk is, however, much shorter than the interval Tp of the timing signals embedded in the transmitted data TD for restoring the program clock signal PCK. This makes it possible to substantially neglect the effect of the jitter with respect to the interval Tp. In other words, the average frequency $f_{av}$ of the read clock signal RCK obtained in response to the buffer residual amount can be considered substantially equal to the ideal transmitted rate $f_{sd}$ with respect to the interval Tp.

This will be explained in more detail using expressions. First, the average frequency $f_{av}$ of the read clock signal RCK is given by the following expression.

$$f_{av} = (Tl*f_l + Th*f_h)/Tp, \tag{4}$$

where Tl is a time period during which the selector 17 selects the lower frequency output $f_l$ of the frequency divider 15, and Th is a time period during which the selector 17 selects the higher frequency output $f_h$ of the frequency divider 13, where Tl+Th=Tp.

On the other hand, the following equation holds for the ideal frequency $f_{sd}$ of the transmitted data TD.

$$Tl = (f_{sd} - f_l)*Tp/2f_b. \tag{5}$$

From these equations (4) and (5), it is found that $f_{sd} = f_{av}$ when Th=Tl.

In practice, the transmission rate on the channel 33, which could be the ideal frequency $f_{sd}$, however, includes a deviation Tk*$f_b$ involved due to normalizing the durations Th and Tl by the buffer residual amount detection interval Tk. The deviation with respect to the interval Tp of the timing signals used for restoring the program clock signal PCK is expressed by (Tk*$f_b$)/Tp. It is enough for the frequency difference $f_b$ to be set to a value which fully compensates for the difference of the average frequency $f_{av}$ from the ideal transmission frequency $f_{sd}$, and hence not to be set to a rather higher value. Accordingly, the normalized deviation (Tk*$f_b$)/Tp becomes nearly zero as long as the buffer residual amount detection interval Tk is significantly shorter than the interval Tp between the timing signals inserted in the transmitted data TD.

Thus, even if the deviation thus normalized is taken into account, the average frequency $f_{av}$ of the read clock signal RCK, which is obtained by switching between the two clock signals $f_h$ and $f_l$, becomes very close to the frequency of the program clock signal inserted for transmitting data TD, such as the TS (Transport Stream) clock signal. Thus, the difference between the two frequencies $f_{sd}$ and $f_{av}$ is negligibly small.

As a result, the program clock signal PCK can be restored at high accuracy on the basis of the timing signals extracted from the transmitted data RD which are read out in response to the read clock signal RCK from the buffer 1.

The clock selector circuit 3 shown in FIG. 3 operates, when the transmission rate of the channel 33 temporarily quickens or slows, similarly to when the the transmission rate of the channel 33 is kept at the normal rate $f_{sd}$, as described above, except that the frequency selected by the selector 17 can be temporarily biased to $f_h$ or $f_l$ due to the fluctuations in the data amount supplied to the receiving buffer 1. This is, however, averaged with respect to the extraction interval at which the acquisition circuit 5 extracts the timing signals, thus providing the similar effect.

Moreover, the present embodiment is adapted to generate two read clock signals $f_l$ and $f_h$ by dividing the single frequency $f_s$. This enables the clock selector circuit 3 to be implemented by digital components, which enables a smaller and cheaper clock regenerator to be provided.

The alternative embodiment uses two frequency dividers 13 and 15 so that one of the two read clock signals $f_h$ and $f_l$ can be selected. The two frequencies are not essential. For example, three or more frequency dividers can be applied so that one of three or more clock signals can be selected as the read clock signal RCK.

Figure 4:
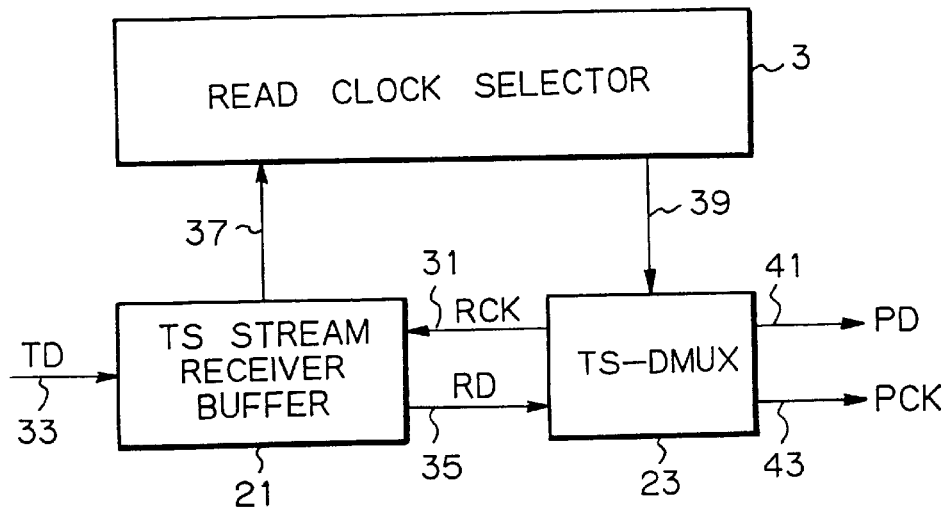
FIG. 4 is a schematic block diagram, like FIG. 1, showing the embodiment of a clock regenerator in accordance with the invention, which is specifically applied to restoring an MPEG clock signal from MPEG data transmitted on an ATM network.

The foregoing embodiments are directed to the clock regenerators used for restoring the program clock signal PCK from the transmitted data TD when the program clock signal to be transmitted has nothing to do with the transmission rate of the transmission channel. The present invention is advantageously applicable to receiver equipment of a network system for transmitting MPEG (Moving Picture Experts Group) data on an ATM (Asynchronous Transfer Mode) network. FIG. 4 shows such an example.

With reference to FIG. 4, the MPEG receiver system includes a TS (transport stream) stream receiving buffer 21, which is adapted to receive an MPEG byte stream, as program data, PD in which a video clock signal has been embedded as a program clock signal PCK. The TS stream receiver buffer 21 has its output 35 connected to a transport stream demultiplexer (TS-DMUX) 23. The transport stream demultiplexer 23 is adapted to read out a TS stream in response to a TS clock signal 39 determined in accordance with the buffer residual amount 37 in the TS stream receiving buffer 21. Thus, the MPEG byte stream PD and the video clock signal PCK are restored by the demultiplexer 23 on its outputs 41 and 43, respectively.

Although the data transmission rate seems to change owing to time fluctuations occurring during the transmission of the transmitted from a transmitter to the receiver system including the clock regenerator of the illustrative embodiments, the clock regenerator used in the receiver system can restore a highly accurate video clock signal with compensating for the rate fluctuations encountered on the ATM network.

The entire disclosure of Japanese patent application No. 133349/1997 filed on May 23, 1997 including the specification, claims, accompanying drawings and abstract of the disclosure is incorporated herein by reference in its entirety.

While the present invention has been described with reference to the particular illustrative embodiments, it is not to be restricted by those embodiments. It is to be appreciated that those skilled in the art can change or modify the embodiments without departing from the scope and spirit of the present invention.

What I claim is:

1. A clock regenerator for restoring a program clock signal of program data from transmitted data synchronized with a transmission clock signal on a transmission channel, the program data being for use in various types of media in an upper layer, the program clock signal being independent of the transmission clock signal, said regenerator comprising:
   a receiving buffer for receiving the transmitted data on the transmission channel, and temporarily storing the transmitted data;
   a first selecting circuit interconnected to said receiving buffer for monitoring said receiving buffer to determine a data amount of the transmitted data stored in said receiving buffer, and for selecting one of read clock signals in response to the data amount determined to develop the one read clock signal selected; and
   a clock acquisition circuit interconnected to said receiving buffer and said first selecting circuit for reading out the transmitted data from said receiving buffer in response to the one read clock signal developed from said first selecting circuit, and for restoring the program clock signal from the transmitted data read out.

2. The clock regenerator in accordance with claim 1, wherein said first selecting circuit comprises:

a monitor circuit interconnected to said receiving buffer for monitoring said receiving buffer to determine the data amount of the transmitted data stored in said receiving buffer; and
   a frequency oscillator interconnected to said monitor circuit for selectively generating one of the read clock signals each having a frequency different from each other in response to the data amount detected by said monitor circuit.

3. The clock regenerator in accordance with claim 1, wherein said first selecting circuit comprises:
   a monitor circuit interconnected to said receiving buffer for monitoring said receiving buffer to determine the data amount of the transmitted data stored in said receiving buffer;
   a frequency oscillator interconnected to said monitor circuit for generating a reference signal having a fixed frequency;
   a first frequency divider interconnected to said frequency oscillator for dividing the fixed frequency to generate a first clock signal with a first frequency higher than a frequency of the transmission clock signal on the transmission channel;
   a second frequency divider interconnected to said frequency oscillator for dividing the fixed frequency to generate a second clock signal with a second frequency lower than the frequency of the transmission clock signal; and
   a second selecting circuit for selecting one of the first and second clock signals in response to the data amount in said receiving buffer determined by said monitor circuit.

4. The clock regenerator in accordance with claim 1, wherein said receiving buffer receives a transport stream transmitted over the transmission channel,
   said clock acquisition circuit comprising a transport stream demultiplexer for reading out, in response to the one read clock signal selected, the transport stream stored in said receiving buffer as the transmitted data, and for restoring an MPEG byte stream as the program data, and a video clock signal as the program clock signal.

5. The clock regenerator in accordance with claim 1, wherein said first selecting circuit periodically monitors said receiving buffer at a first predetermined time interval, the predetermined time interval being set significantly shorter than a second predetermined time interval,
   said clock acquisition circuit extracting, at the second predetermined time interval, the program clock signal from the transmitted data read out from said receiving buffer.

6. A clock regenerator for restoring a program clock signal of program data from transmitted data synchronized with a transmission clock signal on a transmission channel, the program data being for use in various types of media in an upper layer, the program clock signal being independent of the transmission clock signal, said regenerator comprising:
   a receiving buffer to receive the transmitted data on the transmission channel, and temporarily storing the transmitted data;
   a first selecting circuit coupled to said receiving buffer to monitor said receiving buffer to determine a data amount of the transmitted data stored in said receiving buffer, to select a read clock signal in response to the data amount, and to output the selected read clock signal; and a clock acquisition circuit coupled to said receiving buffer and said first selecting circuit to read out the transmitted data from said receiving buffer in response to the selected read clock signal from said first selecting circuit, and to output the program clock signal based on the transmitted data read out from said receiving buffer.

* * * * *